（12）United States Patent
Yee et al.

(10) Patent No.: US 6,825,062 B2
(45) Date of Patent: Nov. 30, 2004

(54) SEMICONDUCTOR PACKAGE AND METHOD OF MAKING USING LEADFRAME HAVING LEAD LOCKS TO SECURE LEADS TO ENCAPSULANT

(75) Inventors: Jae Hak Yee, Seoul (KR); Young Suk Chung, Seoul (KR); Jae Jin Lee, Seoul (KR); Terry Davis, Peoria, AZ (US); Chung Suk Han, Seoul (KR); Jae Hun Ku, Seoul (KR); Jae Sung Kwak, Seoul (KR); Sang Hyun Ryu, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 110 days.

(21) Appl. No.: 10/152,945

(22) Filed: May 22, 2002

(65) Prior Publication Data

US 2003/0020146 A1 Jan. 30, 2003

Related U.S. Application Data

(62) Division of application No. 09/444,035, filed on Nov. 19, 1999, now Pat. No. 6,448,633.

(30) Foreign Application Priority Data

Nov. 20, 1998 (KR) ............................................. 98-49887
Dec. 31, 1998 (KR) ............................................. 98-63126
Dec. 3, 1999 (KR) ............................................. 98-52924

(51) Int. Cl.$^7$ ............................................... H01L 21/44
(52) U.S. Cl. ......................... 438/106; 438/123; 438/127
(58) Field of Search ............................. 438/26, 48, 51, 438/55, 64, 106, 111, 112, 121, 122, 123, 124, 125, 126, 127

(56) References Cited

U.S. PATENT DOCUMENTS 3,838,984 A 10/1974 Crane et al.

(List continued on next page.)

FOREIGN PATENT DOCUMENTS

DE 19734794 A1 8/1997

(List continued on next page.)

*Primary Examiner*—David Nhu
(74) *Attorney, Agent, or Firm*—Stetina Brunda Garred & Brucker

(57) ABSTRACT

A lead frame for making a semiconductor package is disclosed. The leadframe's leads include a lead lock provided at a free end of each inner lead that is adapted to increase a bonding force of the inner lead to a resin encapsulate, thereby effectively preventing a separation of the inner lead from occurring in a singulation process involved in the fabrication of the semiconductor package. A semiconductor package fabricated using the lead frame and a fabrication method for the semiconductor package are also disclosed. The lead frame includes a paddle, a plurality of tie bars for supporting the corners of the paddle, a plurality of leads arranged at each of four sides or two facing sides of the paddle in such a fashion that they are spaced apart from an adjacent side of the paddle while extending perpendicularly to the associated side of the paddle, each of the leads having lead separation preventing means adapted to increase a bonding force of the lead to a resin encapsulate subsequently molded to encapsulate the lead frame for fabrication of the semiconductor package, and dam bars for supporting the leads and the tie bars. Additional package embodiments include exposed protrusions extending downward from the leads. The exposed protrusions are irradiated with a laser to remove set resin prior to a solder ball attachment step.

16 Claims, 14 Drawing Sheets

U.S. PATENT DOCUMENTS

| | | | |
|---|---|---|---|
| 4,054,238 A | 10/1977 | Lloyd et al. |
| 4,530,152 A | 7/1985 | Roche et al. |
| 4,707,724 A | 11/1987 | Suzuki et al. |
| 4,756,080 A | 7/1988 | Thorp, Jr. et al. |
| 4,812,896 A | 3/1989 | Rothgery et al. |
| 4,907,067 A | 3/1990 | Derryberry |
| 5,029,386 A | 7/1991 | Chao et al. |
| 5,041,902 A | 8/1991 | McShane |
| 5,087,961 A | 2/1992 | Long et al. |
| 5,157,480 A | 10/1992 | McShane et al. |
| 5,172,213 A | 12/1992 | Zimmerman |
| 5,172,214 A | 12/1992 | Casto |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,221,642 A | 6/1993 | Burns |
| 5,258,094 A | 11/1993 | Furui et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,294,897 A | 3/1994 | Notani et al. |
| 5,332,864 A | 7/1994 | Liang et al. |
| 5,336,931 A | 8/1994 | Juskey et al. |
| 5,343,076 A | 8/1994 | Katayama et al. |
| 5,406,124 A | 4/1995 | Morita et al. |
| 5,410,180 A | 4/1995 | Fujii et al. |
| 5,424,576 A | 6/1995 | Djennas et al. |
| 5,428,248 A | 6/1995 | Cha |
| 5,435,057 A | 7/1995 | Bindra et al. |
| 5,474,958 A | 12/1995 | Djennas et al. |
| 5,521,429 A | 5/1996 | Aono et al. |
| 5,581,122 A | 12/1996 | Chao et al. |
| 5,592,019 A * | 1/1997 | Ueda et al. ................ 257/666 |
| 5,604,376 A | 2/1997 | Hamburgen et al. |
| 5,608,267 A | 3/1997 | Mahulikar et al. |
| 5,625,222 A | 4/1997 | Yoneda et al. |
| 5,639,990 A | 6/1997 | Nishihara et al. |
| 5,640,047 A | 6/1997 | Nakashima |
| 5,641,997 A | 6/1997 | Ohta et al. |
| 5,646,831 A | 7/1997 | Manteghi |
| 5,650,663 A | 7/1997 | Parthasaranthi |
| 5,683,806 A | 11/1997 | Sakumoto et al. |
| 5,696,666 A | 12/1997 | Miles et al. |
| 5,701,034 A | 12/1997 | Marrs |
| 5,710,064 A | 1/1998 | Song et al. |
| 5,736,432 A | 4/1998 | Mackessy |
| 5,776,798 A | 7/1998 | Quan et al. |
| 5,783,861 A | 7/1998 | Son |
| 5,835,988 A | 11/1998 | Ishii |
| 5,844,306 A | 12/1998 | Fujita et al. |
| 5,859,471 A | 1/1999 | Kuraishi et al. |
| 5,866,939 A | 2/1999 | Shin et al. |
| 5,877,043 A | 3/1999 | Alcoe et al. |
| 5,886,398 A | 3/1999 | Low et al. |
| 5,894,108 A | 4/1999 | Mostafazadeh et al. |
| 5,942,794 A | 8/1999 | Okumura et al. |
| 5,959,356 A | 9/1999 | Oh |
| 5,973,388 A | 10/1999 | Chew et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,986,885 A | 11/1999 | Wyland |
| 6,001,671 A | 12/1999 | Fjelstad |
| 6,025,640 A | 2/2000 | Yagi et al. |
| 6,034,423 A | 3/2000 | Mostafazadeh et al. |
| 6,072,228 A | 6/2000 | Hinkle et al. |
| 6,130,115 A | 10/2000 | Okumura et al. |
| 6,130,473 A | 10/2000 | Mostafazadeh et al. |
| 6,140,154 A | 10/2000 | Hinkle et al. |
| 6,143,981 A | 11/2000 | Glenn |
| 6,184,465 B1 | 2/2001 | Corisis |
| 6,198,171 B1 | 3/2001 | Huang et al. |
| 6,225,146 B1 | 5/2001 | Yamaguchi et al. |
| 6,229,200 B1 | 5/2001 | Mclellan et al. |
| 6,242,281 B1 | 6/2001 | Mclellan et al. |
| 6,281,566 B1 | 8/2001 | Magni |
| 6,281,568 B1 | 8/2001 | Glenn et al. |
| 6,294,100 B1 | 9/2001 | Fan et al. |
| 6,307,272 B1 * | 10/2001 | Takahashi et al. .......... 257/787 |
| 6,369,454 B1 * | 4/2002 | Chung ........................ 257/787 |
| 6,384,472 B1 | 5/2002 | Huang |

FOREIGN PATENT DOCUMENTS

| | | |
|---|---|---|
| EP | 0794572 A2 | 10/1997 |
| JP | 5745959 | 3/1982 |
| JP | 59208756 | 11/1984 |
| JP | 59227143 | 12/1984 |
| JP | 60195957 | 10/1985 |
| JP | 60231349 | 11/1985 |
| JP | 6139555 | 2/1986 |
| JP | 629639 | 1/1987 |
| JP | 63205935 | 8/1988 |
| JP | 63233555 | 9/1988 |
| JP | 1106456 | 4/1989 |
| JP | 6092076 | 4/1994 |
| JP | 7312405 | 11/1995 |
| JP | 8125066 | 5/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| KR | 941979 | 1/1994 |
| KR | 9772358 | 11/1997 |

* cited by examiner

SEMICONDUCTOR PACKAGE AND METHOD OF MAKING USING LEADFRAME HAVING LEAD LOCKS TO SECURE LEADS TO ENCAPSULANT

RELATED APPLICATION

The present application is a divisional of U.S. application Ser. No. 09/444,035 entitled SEMICONDUCTOR PACKAGE AND METHOD OF MAKING USING LEADFRAME HAVING LEAD LOCKS TO SECURE LEADS TO ENCAPSULANT filed Nov. 19, 1999 now U.S. Pat. No. 6,448,633.

BACKGROUND OF THE INVENTION

1. Field of the Invention

The present invention relates to a lead frame with lead separation preventing means, a semiconductor package using the lead frame, and a method for fabricating the semiconductor package. More particularly, the present invention relates to a lead frame having a lead separation preventing means provided at a free end of each inner lead and adapted to increase a bonding force of the inner lead to a resin encapsulate encapsulating the lead frame to fabricate a semiconductor package, thereby effectively preventing a separation of the inner lead from occurring in a singulation process involved in the fabrication of the semiconductor package. The present invention also relates to the semiconductor package fabricated using the lead frame, and a fabrication method for the semiconductor package.

2. Description of the Related Art

In pace with the recent trend of electronic appliances, such as electronic products for domestic and official purposes, communication appliances, and computers, toward a compactness and high performance, semiconductor packages, which are used for such electronic appliances, have been required to have a compact, highly multi-pinned, light, simple structure.

Such a requirement for semiconductor packages has resulted in developments of semiconductor packages having a structure in which the lower surface of each lead is exposed at the bottom of the resin encapsulate. For such semiconductor packages, there are bottom lead type semiconductor packages and lead end grid array type semiconductor packages. Currently, the demand of semiconductor packages having such a structure is being increased.

Similarly to typical quad-flat or bi-flat type semiconductor packages, such bottom lead type or lead end grid array type semiconductor packages can be fabricated using a well-known method. This method may involve a sawing step for cutting a wafer formed with a plurality of semiconductor chip units into pieces respectively corresponding to those semiconductor chip units, thereby separating the semiconductor chip units from one another, a semiconductor chip mounting step for mounting the semiconductor chip units on respective paddles of lead frame units integrally formed on a lead frame strip by means of a thermally-conductive adhesive resin, a wire bonding step for electrically connecting a free end of each inner lead, included in each lead frame unit, to an associated one of input/output terminals of the semiconductor chip unit mounted on the lead frame unit, a resin encapsulate molding step for molding a resin encapsulate adapted to encapsulate each semiconductor chip unit and a bonding region including bonding wires for the semiconductor chip unit, using encapsulating resin, for the protection of those elements from external environments, thereby forming semiconductor packages each including one semiconductor chip unit and one lead frame unit, a singulation step for cutting inner portions of dam bars of each lead frame unit, thereby separating the semiconductor packages from one another, and a marking step for marking characters or signs on the surface of the resin encapsulate included in each semiconductor package. In the fabrication of quad-flat or bi-flat semiconductor packages, a lead forming step is involved to form leads outwardly protruded by a considerable length from a resin encapsulate into a particular terminal shape, for example, a "J" shape. In the fabrication of bottom lead type or lead end grid array type semiconductor packages, however, it is typically unnecessary to use such a lead forming step. In bottom lead type or lead end grid array type semiconductor packages, the lower surface or free end of each lead is exposed at the bottom of the resin encapsulate. Accordingly, the exposed portion of each lead may be directly used as an external input/output terminal or attached with a solder ball to be used as an external input/output terminal.

A typical structure of such quad-flat or bi-flat semiconductor packages is illustrated in a cross-sectional view of FIG. 9. Now, this structure will be described in brief in conjunction with FIG. 9. In FIG. 9, the reference numeral 1' denotes a semiconductor package having a quad-flat or bi-flat structure. As shown in FIG. 9, this semiconductor package includes a semiconductor chip 2 bonded to a paddle 16 by means of a thermally-conductive epoxy resin 32, and a plurality of leads 11 arranged at each of four sides or two facing sides of the paddle 16 in such fashion that they are spaced apart from the associated side of the paddle 16 while extending perpendicularly to the associated side of the paddle 16. The semiconductor package also includes a plurality of conductive wires 3 for electrically connecting the inner leads 12 to the semiconductor chip 2, respectively, and a resin encapsulate 4 for encapsulating the semiconductor chip 2 and conductive wires 3. The semiconductor package further includes outer leads 13 extending outwardly from the inner pads 12, respectively. Each outer lead 13 has a particular shape, for example, a "J" shape, so that it is used as an input/output terminal in a state in which the semiconductor package is mounted on a mother board.

FIGS. 10A and 10B are, respectively, a plan view illustrating a conventional lead frame and a cross-sectional view illustrating a bottom lead type semiconductor package fabricated using the lead frame, respectively.

As shown in FIG. 10A, the lead frame, which is denoted by the reference numeral 10', includes a paddle 16, tie bars 15 for supporting respective corners of the paddle 16, a plurality of leads 11 arranged at each of four sides of the paddle 16 in such a fashion that they extend perpendicularly to the associated side of the paddle 16, and dam bars 17 for supporting the leads 11 and tie bars 15. Each lead 11 has an inner lead 12 encapsulated by a resin encapsulate (shown by phantom lines 21 in FIG. 10A) to be subsequently formed, and an outer lead 13 extending outwardly from the resin encapsulate. Dotted lines 23 inside the dam bars 17 represent singulation lines along which the lead frame 10' is cut after completing a semiconductor chip mounting process, a wire bonding process, and a resin encapsulate molding process. In FIG. 10A, the reference numeral 18 denotes side rails.

The bottom lead type semiconductor package denoted by the reference numeral 1'' in FIG. 10B is that fabricated using the lead frame of FIG. 10A. As shown in FIG. 10B, the semiconductor package 1'' includes a semiconductor chip 2 bonded to the paddle 16 of the lead frame 10', along with the leads 11 of the lead frame 10'. As mentioned above, the leads 11 are arranged at each of four sides of the paddle 16 while being spaced apart from the associated side of the paddle 16 by a desired distance. The semiconductor package 1" also includes conductive wires 3 for electrically connecting the inner leads to the semiconductor chip 2, and a resin encapsulate 4 for encapsulating the semiconductor chip 2 and conductive wires 3. The outer lead 13 of each lead 11 has a length shorter than that of a typical quad-flat semiconductor package. Typically, the outer lead of each lead 11 is not subjected to any forming process. The lower surface of each inner lead 12 is exposed at the bottom of the resin encapsulate 4, so that it serves as an external input/output terminal, along with the lower surface of the associated outer lead 13.

In the above mentioned bottom lead type semiconductor package 1", however, the inner leads 12, which are encapsulated in the resin encapsulate 4 in such a fashion that their lower surfaces are exposed, have a planar structure having a simple rectangular shape or an end-rounded rectangular shape. By virtue of such a planar structure of the inner leads 12, there is a high possibility for the leads 11 to be separated from the resin encapsulate 4 due to cutting impact applied thereto in a singulation process for cutting them inside the dam bars 17 or for the conductive wires 3 bonded to the leads 12 to be short-circuited due to vibrations generated in the singulation process. This problem becomes more severe in the case of a compact and highly multi-pinned package structure having an increased number of leads because the increased number of leads results in a reduction in the width of each lead, thereby reducing the area of each lead contacting the resin encapsulate.

In an operation of the semiconductor chip, problems similar to those occurring in the singulation process may occur. For example, the bonding force between the leads and the resin encapsulate 4 may be degraded due to a considerable thermal expansion difference among the paddle 16, leads 11, conductive wires 3 and resin encapsulate 4. Due to the same reason, the conductive wires 3 may be shorted-circuited.

FIG. 11 is a cross-sectional view illustrating a conventional lead end grid array type semiconductor package. This lead end grid array type semiconductor package has the same basic structure as that of the bottom lead type semiconductor package shown in FIG. 10B. Accordingly, the lead end grid array type semiconductor package of FIG. 11 will be described only in conjunction with its differences from FIG. 10B.

The semiconductor package of FIG. 11, which is denoted by the reference numeral 1''', has leads 11 formed in accordance with a half etch process to have protrusions 19, respectively. The protrusion 19 of each lead 11 has a lower surface exposed at the bottom of the resin encapsulate 4. In order to allow the semiconductor package 1''' to have a light, thin, simple and compact structure, the peripheral portion of the semiconductor chip 2 extends beyond the peripheral edge of the paddle 16 to a region, where the inner ends of the leads 11 are positioned. That is, the peripheral portion of the semiconductor chip 2 is positioned above the inner ends of the leads 11. The protrusion 19 of each lead 11 is attached at its lower surface with a solder ball 5 serving as an external input/output terminal. In the above mentioned conventional lead end grid array type semiconductor package 1''', however, the inner ends of the leads 11 may come into contact with the lower surfaces of the semiconductor chip 2 in the case where the semiconductor chip 2 is bonded to the paddle 16 without keeping its accurate horizontal position, where the inner ends of the leads 11 are raised or laterally leaned during the process for injecting melted resin of high temperature and pressure to mold the resin encapsulate 4, or where the inner ends of the leads 11 are deformed, due to a careless operator, in such a fashion that they are raised. When the inner ends of the leads 11 come into contact with the lower surface of the semiconductor chip 2, a short circuit or electric leakage may occur. As a result, the semiconductor package 1''' may operate abnormally or break down.

In the fabrication of the above mentioned conventional lead end grid array type semiconductor package 1''', there is also a possibility for the protrusions 19 of the leads 11 to be partially or completely coated with the encapsulating resin at their lower surfaces due to a flash phenomenon which may occur in the resin molding process. The flash phenomenon is a phenomenon wherein the melted encapsulating resin spreads through gaps defined by the leads and a mold used. In such a case, it is impossible to securely attach solder balls 5 to the protrusions 19 of the leads 11. Although the attachment of solder balls 5 is achieved, these solder balls 5 may be easily detached. Furthermore, the attached solder balls 5 exhibit a degraded conduction quality. Consequently, there is a high possibility for the solder balls 5 to lose their function as external terminals.

In order to solve this problem, conventional semiconductor package fabricating methods involve a process for removing set resin film partially or completely coated over the lower surface of each protrusion 19, that is, a solder ball land 19a, after the completion of the molding process. Conventionally, this process is carried out using a chemical treating method using a strong acid such as sulfuric acid or hydrochloric acid or a mechanical treating method using metal bead impact or water jet. However, the chemical treating method involves problems of environmental pollution and requirement of purification. On the other hand, the mechanical treating method involves formation of cracks in the resin encapsulate 4, generation and accumulation of static electricity, and existence of residual flashed resin in a set state.

SUMMARY OF THE INVENTION

Therefore, a primary object of the invention is to provide a lead frame provided with a lead lock adapted to increase the bonding force of inner leads to a resin encapsulate, thereby being capable of effectively preventing a separation of the leads from the resin encapsulate upon cutting the leads for a singulation of bottom lead type semiconductor packages. The embodiments of lead locks described herein prevent the leads from being separated from the encapsulate in a lateral direction parallel to the length of the lead and/or a vertical direction perpendicular to the length of the lead.

A secondary object of the invention is to provide a semiconductor package fabricated using the lead frame capable of accomplishing the primary object of the invention.

A third object of the invention is to provide a lead end grid array type semiconductor package having an insulating structure capable of preventing the inner ends of leads from coming, at their upper surfaces, into contact with the lower surface of an associated semiconductor chip.

A fourth object of the invention is to provide a method for fabricating the semiconductor package capable of accomplishing the third object of the invention.

A fifth object of the invention is to provide a method for fabricating a lead end grid array semiconductor package, which method is capable of safely and surely removing set resin coated on solder ball lands after being flashed, without causing generation of static electricity, formation of cracks, environmental pollution, and requirement of any separate machine.

In accordance with one aspect, the present invention provides a lead frame for a bottom lead type or lead end grid type semiconductor package comprising: a rectangular or square paddle for mounting a semiconductor chip thereon; a plurality of tie bars for supporting the paddle; a plurality of leads arranged at each of four sides or two facing sides of the paddle in such a fashion that they are spaced apart from the associated side of the paddle while extending perpendicularly to the associated side of the paddle, each of the leads having one or more lead locks adapted to increase a bonding force of the lead to a resin encapsulate subsequently molded to encapsulate the lead frame for fabrication of the semiconductor package; and dam bars for supporting the leads and the tie bars.

In accordance with another aspect, the present invention provides a semiconductor package comprising: a paddle; a semiconductor chip mounted on the paddle by an adhesive layer interposed between the paddle and the semiconductor chip; a plurality of leads arranged at each of four sides or two facing sides of the paddle in such a fashion that they are spaced apart from the associated side of the paddle while extending perpendicularly to the associated side of the paddle, each of the leads having one or more lead locks; conductive wires for electrically connecting respective inner ends of the leads to the semiconductor chip; a resin encapsulate for encapsulating the semiconductor chip and the conductive wires; and each of the leads having a lower surface exposed at the bottom of the resin encapsulate within a region where the resin encapsulate is arranged.

In accordance with another aspect, the present invention provides a semiconductor package comprising: a paddle, a plurality of leads arranged at each of four sides or two facing sides of the paddle in such a fashion that they are spaced apart from the associated side of the paddle while extending perpendicularly to the associated side of the paddle, each of the leads having a protrude at a lower surface thereof; a semiconductor chip mounted on the paddle in such a fashion that a peripheral portion thereof is arranged over an inner end of each of the leads; an electrical insulator for preventing the leads from coming into electrical contact with the semiconductor chip; conductive wires for electrically connecting respective inner ends of the leads to the semiconductor chip; and a resin encapsulate for encapsulating the semiconductor chip and the conductive wires.

In accordance with another aspect, the present invention provides a method for fabricating semiconductor packages by mounting semiconductor chips each having input/output pads on paddles of lead frame units included in a lead frame strip, each of the lead frame units having a plurality of leads each having an inner lead and an outer lead integral with each other, each of the semiconductor chip being arranged over the inner leads of the leads associated therewith at a peripheral portion thereof, comprising: a semiconductor chip mounting step for mounting each of the semiconductor chips on at least the upper surfaces of the inner leads associated therewith by thermally-conductive insulator; a wire bonding step for electrically connecting an inner end of each inner lead to an associated one of input/output pads of the semiconductor chip via a conductive wire; a resin encapsulate molding step for molding a resin encapsulate adapted to encapsulate the semiconductor chip along with the conductive wires and the inner leads associated with the semiconductor chip while allowing each of the associated inner leads to have a portion exposed at the bottom of the resin encapsulate; and a singulation step for cutting the outer leads of the lead frame strip around the resin encapsulates at regions where outer ends of the outer leads respectively included in adjacent ones of the lead frame units are connected to each other.

In accordance with another aspect, the present invention provides a method for fabricating semiconductor packages comprising: a lead frame preparing step for preparing a lead frame strip including a plurality of lead frame units each having a paddle, and a plurality of leads each having an inner lead and an outer lead integral with each other, the inner lead having a protrusion protruded from a lower surface of the inner lead at an inner end of the inner lead; a semiconductor chip mounting step for mounting a semiconductor chip on the paddle of each of the lead frame units; a wire bonding step for electrically connecting the mounted semiconductor chip to the inner end of each of the inner leads at an upper surface of the inner lead via a conductive wire; a resin encapsulate molding step for molding a resin encapsulate adapted to encapsulate the semiconductor chip along with the conductive wires and the inner ends of the inner leads associated with the semiconductor chip while allowing each of the protrusions to have a lower surface exposed at the bottom of the resin encapsulate; a marking and cleaning step for radiating a laser beam onto a surface of the resin encapsulate to mark characters or signs on the surface of the resin encapsulate while radiating a laser beam onto the lower surface of each of the protrusions to remove set resin coated on the lower surface of the protrusion after being flashed during the resin encapsulate molding step; and a singulation step for cutting the outer leads of the lead frame strip around the resin encapsulates at regions where the outer ends of the outer leads respectively included in adjacent ones of the lead frame units are connected to each other.

BRIEF DESCRIPTION OF THE DRAWINGS

Other objects and aspects of the invention will become apparent from the following description of embodiments with reference to the accompanying drawings in which.

DESCRIPTION OF THE PREFERRED EMBODIMENTS

Figure 1:
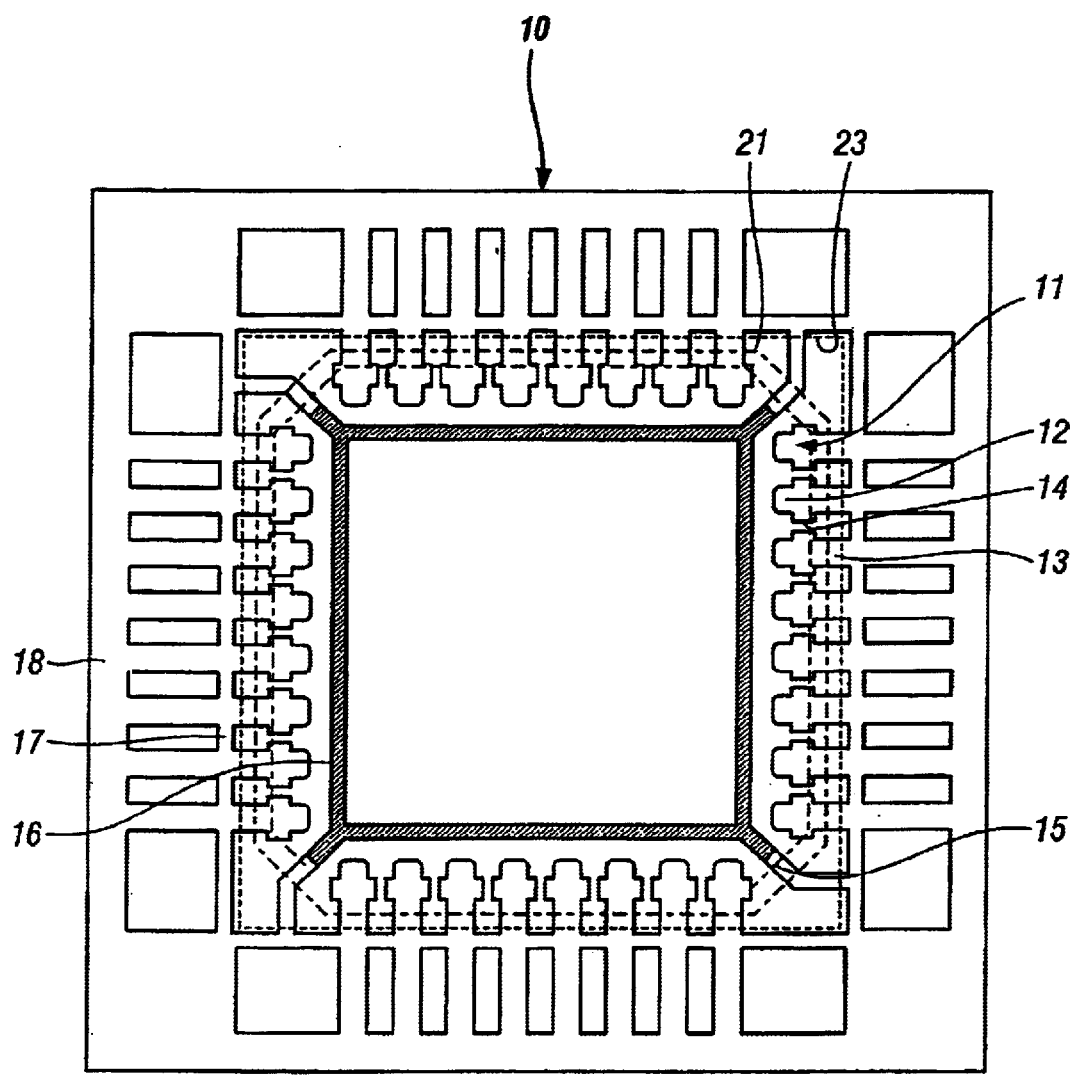
FIG. 1 is a plan view illustrating a lead frame provided with a locking lug type lead lock in accordance with a first embodiment of the present invention.

FIGS. 1 to 6B illustrate lead frames respectively according to various embodiments of the present invention adapted to accomplish the primary and secondary objects of the present invention. All the lead frames, which are denoted in the reference numeral 10 in FIGS. 1 to 6B, have a basic configuration including a rectangular or square paddle 16, a plurality of tie bars 15 for supporting the paddle 16, and a plurality of leads 12 arranged at each of four sides or two facing sides of the paddle 16 while being spaced apart from the associated side of the paddle 16. Each lead 12 is provided, at its portion adjacent to the paddle 16, with a lead lock 14 adapted to increase the bonding force of the lead 12 to a resin encapsulate 4 to be subsequently formed. The lead lock embodiments prevent separation of the leads from the encapsulant resin in a lateral and/or vertical direction. The basic lead frame configuration also includes dam bars 17 for supporting the leads 12 and tie bars 15.

The lead frames shown in FIGS. 1 to 6B can be advantageously used to fabricate bottom lead type semiconductor packages in which the entire lower surface of each inner lead 12 is exposed at the bottom of the resin encapsulate 4, as shown in FIGS. 3C, 3D, 4, 5E, 6A, and 6B, or lead end grid type semiconductor packages in which only the lower surface of the protruded end 19 protruded from the lower surface of each inner lead 12 is exposed at the bottom of the resin encapsulate 4, as shown in FIGS. 7A to 7D.

Figure 9:
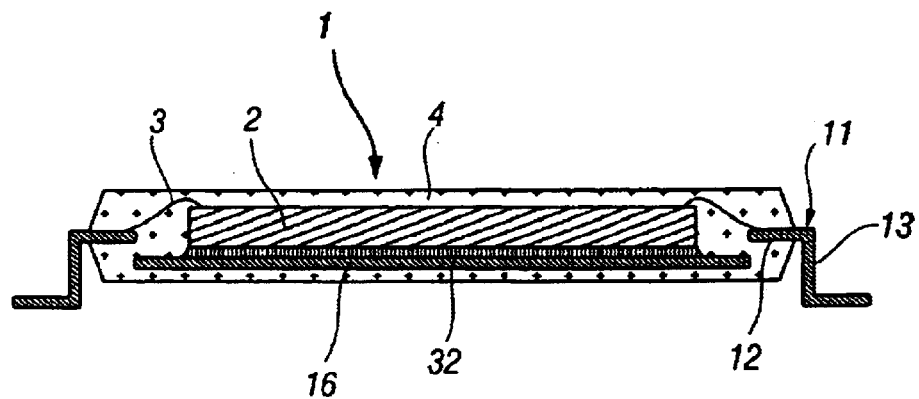
FIG. 9 is a cross-sectional view illustrating a conventional quad-flat or bi-flat semiconductor package.
Figure 10A:
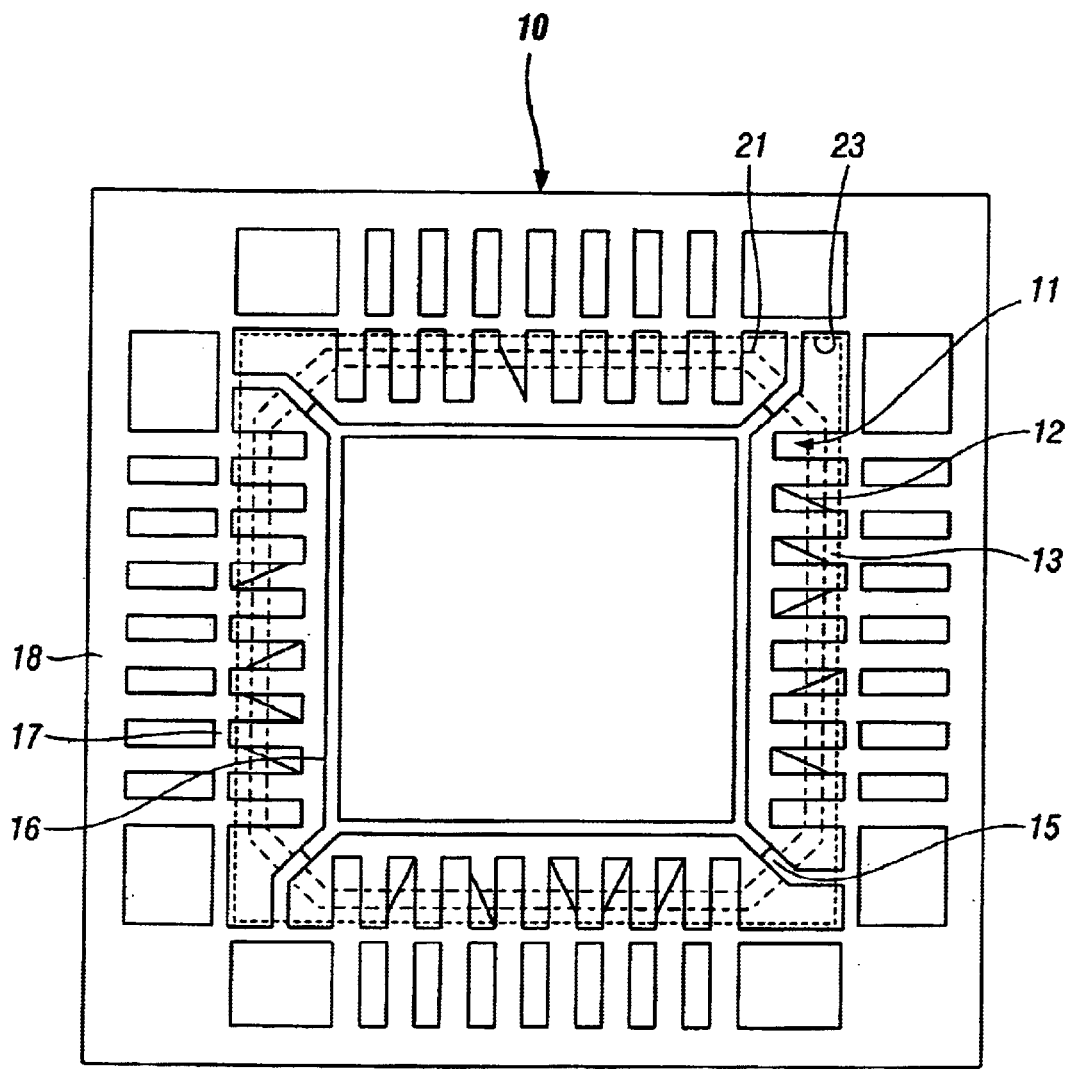
FIGS. 10A and 10B are a plan view illustrating a conventional lead frame and a cross-sectional view illustrating a bottom lead type semiconductor package fabricated using the conventional lead frame, respectively.
Figure 10B:
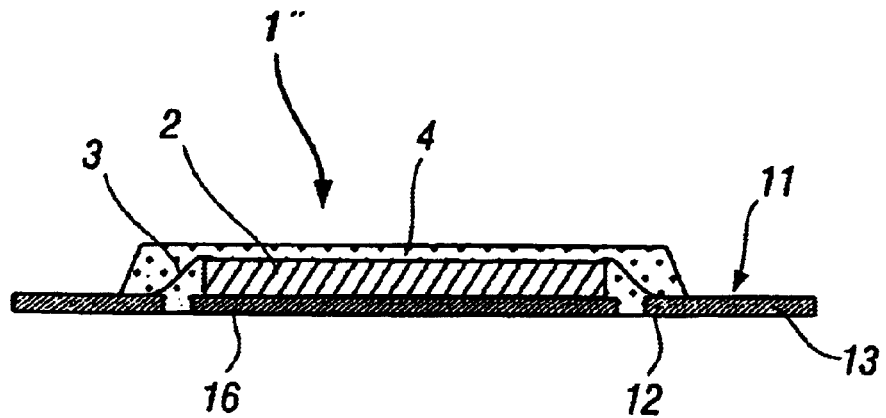

Now, the lead frames adapted to accomplish the primary and secondary objects of the present invention will be described in conjunction with FIGS. 1 to 6B, respectively. In FIGS. 1 to 6B, elements respectively corresponding to those in FIGS. 9 to 10B are denoted by the same reference numerals.

FIG. 1 is a plan view illustrating a lead frame 1 which is provided with locking lug type lead lock 14 in accordance with a first embodiment of the present invention. As shown in FIG. 1, the lead frame 1 basically includes a paddle 16, tie bars 15 for supporting four corners of the paddle 16, a plurality of leads 11 arranged adjacent to each of four sides of the paddle 16 while extending perpendicularly to the associated side of the paddle 16, and dam bars 17 for supporting the leads 11 and tie bars 15.

The paddle 16 has a flat plate shape, as shown in FIG. 1. In order to increase the bonding force to the resin encapsulate (not shown), the paddle 16 has a partially etched structure at its peripheral portion. However, the present invention is not limited to such a structure of the paddle 16. In accordance with the present invention, the paddle 16 may have a rectangular or square frame structure having a central opening. The shape and area of the paddle and the structure of the paddle including a central opening or not including the central opening are optional. The present invention is not limited by these factors. In accordance with the present invention, the tying position and number of the tie bars 15 are also optional. These factors are not construed to limit the present invention.

In accordance with the embodiment of the present invention illustrated in FIG. 1, the lead lock 14 comprises locking lugs laterally protruded from opposite side edges of each inner lead 12 at a free end of the inner lead 12, respectively. Although each locking lug has a rectangular shape in the illustrated case, it is not limited thereto. The locking lugs may have a variety of shapes such as a triangular shape or a circular shape. The number of locking lugs is also optional. For example, only one locking lug may be formed at one side edge of each inner lead 12. Alternatively, a plurality of locking lugs may be formed at each side edge of each inner lead 12.

Since each inner lead 12 is provided with the lead lock 14 comprising locking lugs in accordance with the embodiment of the present invention shown in FIG. 1, all leads 11 can be firmly locked in position even when they receive cutting impact during a singulation process carried out after the formation of a resin encapsulate. Accordingly, there is no possibility for the leads 11 to be separated (e.g., in a lateral direction) from the resin encapsulate 4 or for the conductive wires 3 bonded to the leads 11 to be short-circuited due to vibrations generated in the singulation process.

Alternatively, each tie bar 15 may have a partially etched structure at its portion arranged within a region where the paddle 16 and/or resin encapsulate is formed, in order to achieve an enhancement in the bonding strength to the semiconductor chip and/or resin encapsulate. For the same purpose, each lead 11 may be partially etched to have a partially etched structure at its inner end.

Dotted lines 23 inside the dam bars 17 represent singulation lines along which the lead frame 10' is cut after completing a semiconductor chip mounting process, a wire bonding process, and a resin encapsulate molding process. In FIG. 1, the reference numeral 18 denotes side rails.

Figure 2:
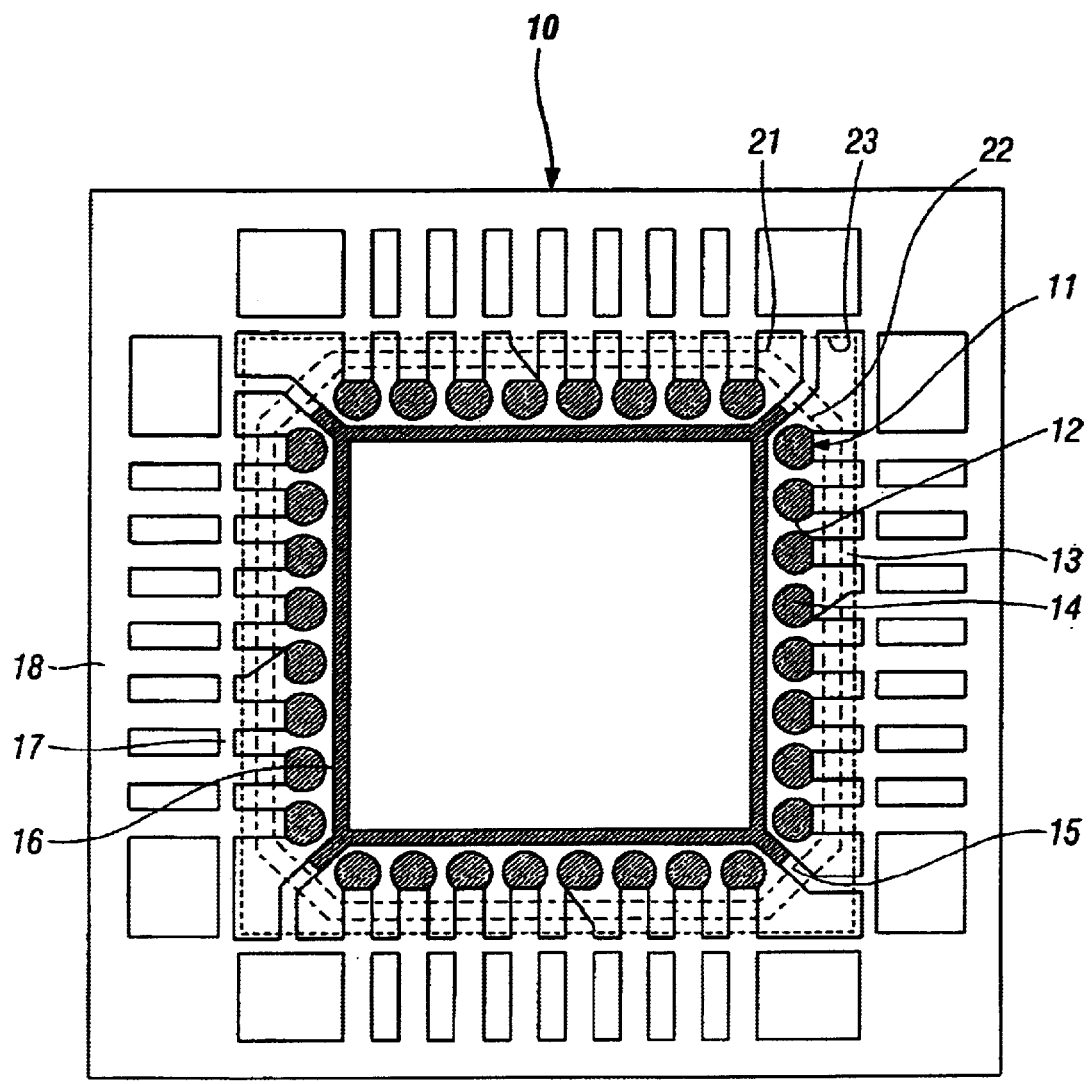
FIG. 2 is a plan view illustrating a lead frame having a disk type lead lock in accordance with a second embodiment of the present invention.

FIG. 2 is a plan view illustrating a lead frame 10 having disk type lead lock 14 in accordance with a second embodiment of the present invention. The lead frame of the second embodiment has the same basic configuration as that of the first embodiment, except for the shape of the lead lock 14. Accordingly, no description will be made for the same basic configuration.

In accordance with the second embodiment of the present invention, the lead lock 14 of each inner lead 12 forms a free end of the inner lead 12 by itself. As shown in FIG. 2, the lead lock 14 has an enlarged disk shape having a diameter larger than the width of each inner lead 12. Of course, this shape is not construed to limit the present invention. The lead lock 14 may have an oval shape or a double disk shape. The double disk shape may be formed to have at least two disk portions. For example, such a double disk shape may be a three or four-leafed clover shape.

Since each inner lead 12 is provided with the lead lock 14 having an enlarged disk structure in accordance with the embodiment of the present invention shown in FIG. 2, all leads 11 can be firmly locked in position even when they receive cutting impact during a singulation process carried out after the formation of a resin encapsulate. Accordingly, there is no possibility for the leads 11 to be separated from the resin encapsulate 4 or for the conductive wires 3 bonded to the leads 11 to be short-circuited due to vibrations generated in the singulation process. For example, lateral motion of the encapsulated lead is prevented.

Figure 3A:
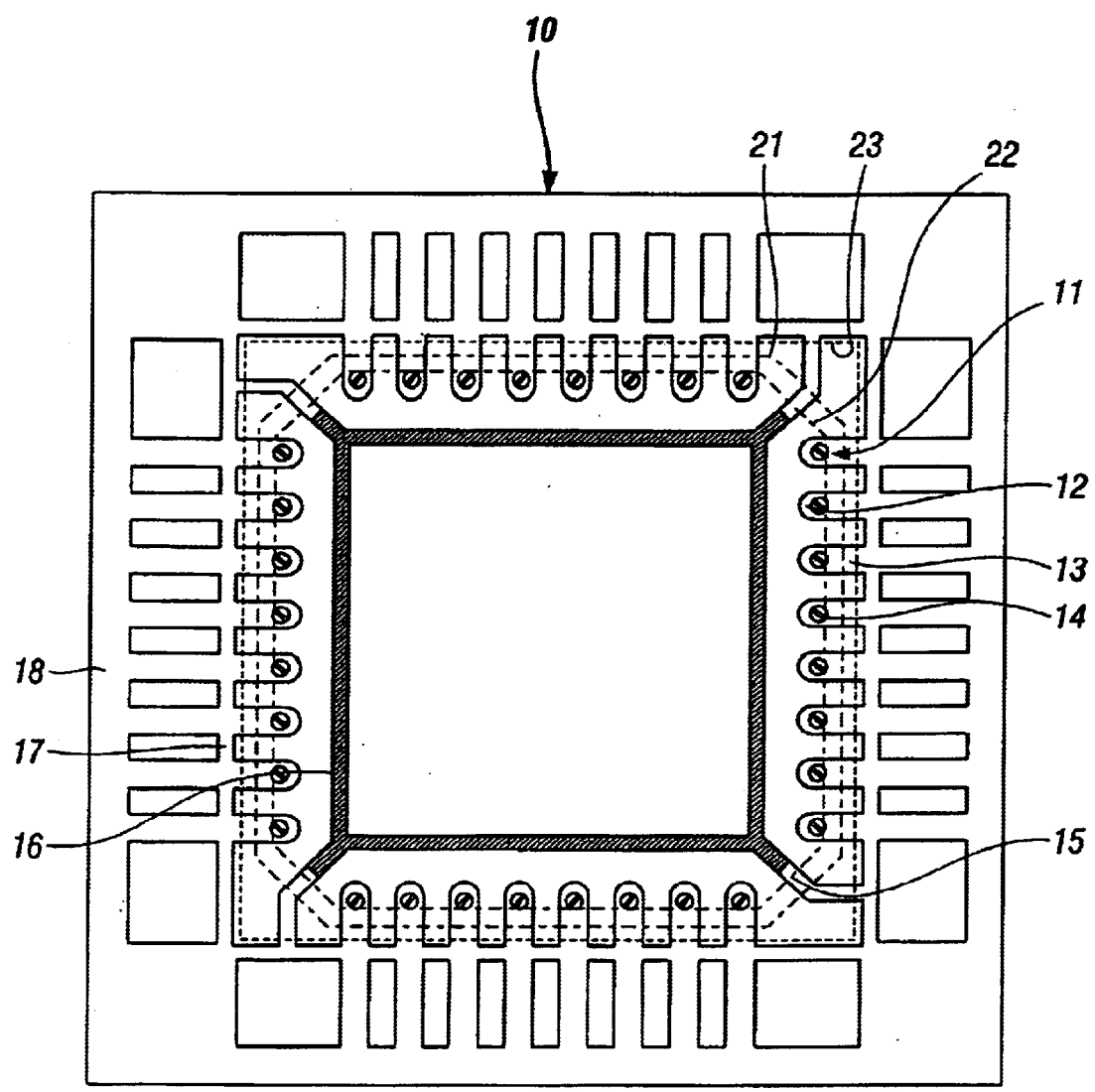
FIGS. 3A and 3B are plan views respectively illustrating lead frames having a dimple type lead lock in accordance with a third embodiment of the present invention.
Figure 3B:
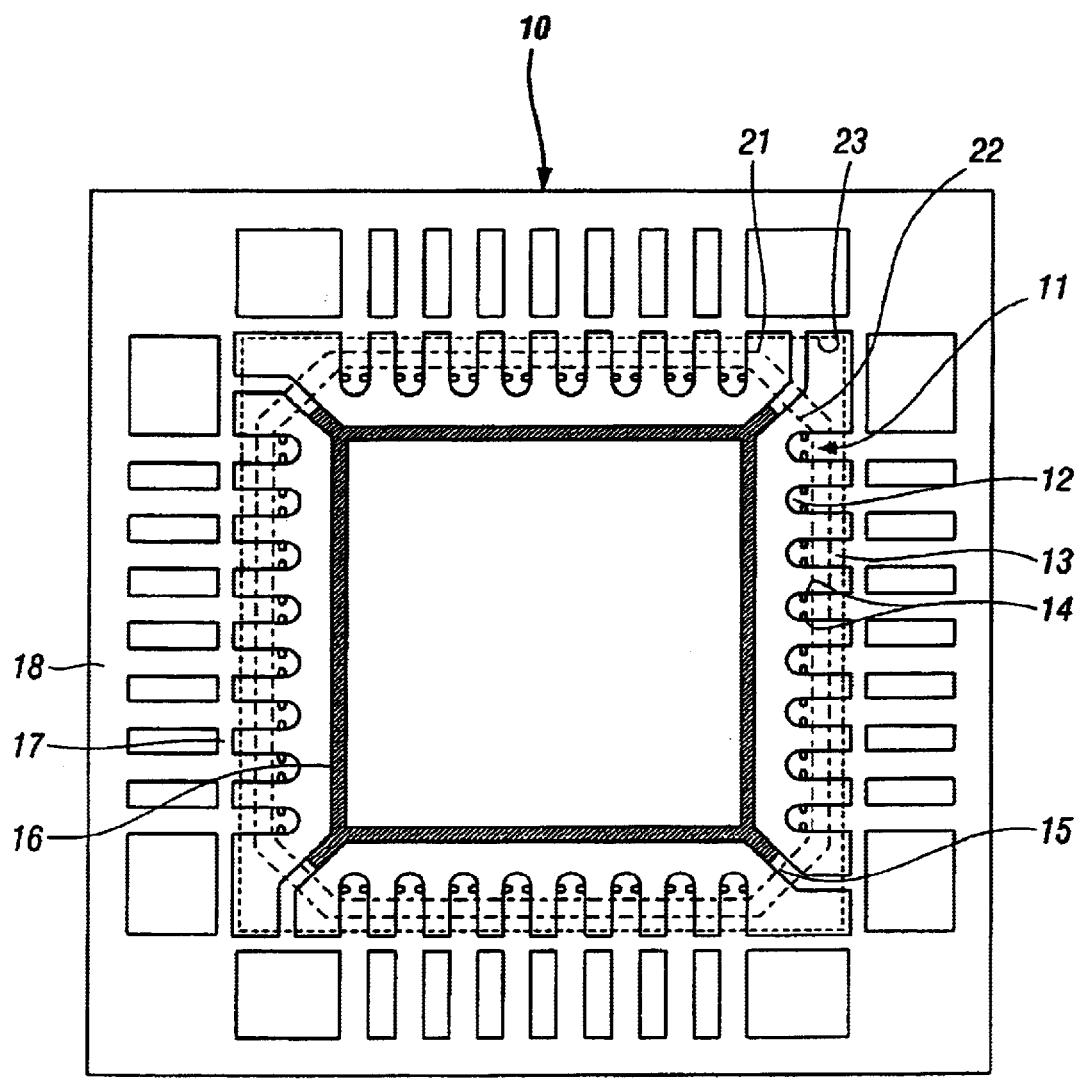

FIGS. 3A and 3B are plan views respectively illustrating a lead frame 10 having dimple type lead lock(s) 14 in accordance with a third embodiment of the present invention. The lead frame of the third embodiment has the same basic configuration as those of the first and second embodiments, except that the lead lock(s) 14 has a dimple shape. Accordingly, no description will be made for the same basic configuration.

In accordance with the third embodiment of the present invention illustrated in FIGS. 3A and 3B, the lead lock 14 of each inner lead 12 comprises one or two dimples formed at a free end of the inner lead 12. By virtue of such dimples, all leads 11 can be firmly locked in position even when they receive cutting impact during a singulation process carried out after the formation of a resin encapsulate. Accordingly, there is no possibility for the leads 11 to be separated from the resin encapsulate 4 or for the conductive wires 3 bonded to the leads 11 to be short-circuited due to vibrations generated in the singulation process.

FIG. 3A illustrates a case in which a single dimple is centrally formed at the free end of each inner lead 12. On the other hand, FIG. 3B illustrates a case in which two dimples are formed at opposite sides of the each inner lead 12, respectively, in such a fashion that each of them extends partially over an associated peripheral edge of the inner lead 12 and an associated side surface of the inner lead 12. Such a dimple structure is not construed to limit the present invention. The number and position of dimples are optional in accordance with the present invention. Such dimples may be additionally provided at each inner lead configured in accordance with the first or second embodiment. Such a configuration is optional in accordance with the present invention.

Figure 3C:
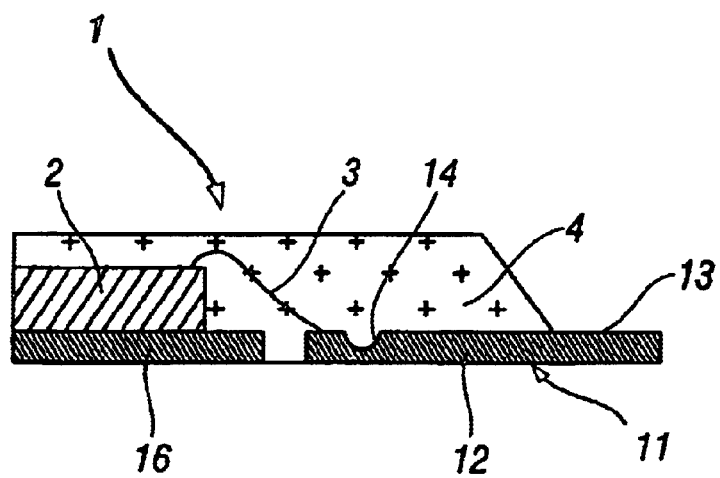
FIG. 3C is a cross-sectional view partially illustrating a semiconductor package fabricated using a lead frame provided with at least one aperture, in place of the dimple, as the lead lock.

FIG. 3C is a cross-sectional view partially illustrating a semiconductor package 1 fabricated using a lead frame 10 having the same configuration as the lead frame of FIG. 3A. As shown in FIG. 3C, this semiconductor package 1 includes a semiconductor chip 2 mounted on a paddle 16 of the lead frame 10 by means of an adhesive layer, leads 11 each provided at an inner end thereof with a dimple as a lead lock 14, conductive wires 3 for electrically connecting an inner free end of an inner lead 12 included in each lead 11 to the semiconductor chip 2, and a resin encapsulate 4 for protecting the semiconductor chip 2 and conductive wires 3 from external environments. In this semiconductor package 1, the leads 11 are firmly locked to the resin encapsulate 4 by virtue of the dimples each formed on the upper surface of each inner lead 12 at the inner end of the inner lead 12.

Figure 3D:
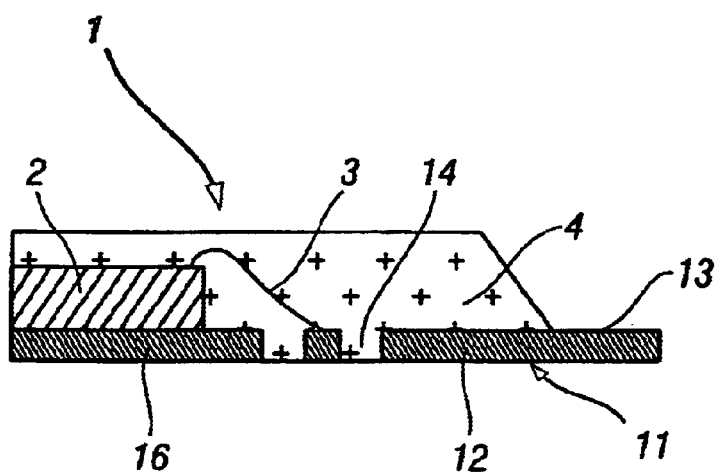

FIG. 3D is a cross-sectional view partially illustrating a semiconductor package 1 fabricated using a lead frame (not shown) provided with at least one aperture, in place of the dimple, as the lead lock 14 for each lead 11. In this case, the aperture serves to firmly lock the associated lead 11 to the resin encapsulate 4. Accordingly, there is no possibility for the leads to be separated from the resin encapsulate 4 during a singulation process. For example, lateral motion of the encapsulated lead is prevented.

Figure 4:
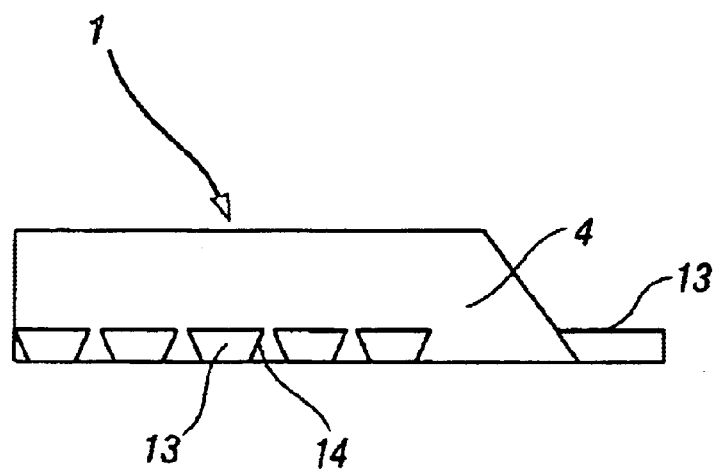
FIG. 4 is a cross-sectional view partially illustrating a semiconductor package fabricated using a lead frame having a side wall type lead lock according to a fourth embodiment of the present invention.

FIG. 4 is a cross-sectional view partially illustrating a semiconductor package 1 fabricated using a lead frame (not shown) according to a fourth embodiment of the present invention. In accordance with the fourth embodiment, each lead 11 has an inverted-trapezoidal cross section in such a fashion that it has a maximum width at the top thereof and a minimum width at the bottom thereof. That is, each lead 11 has inclined side walls serving as lead lock 14. Since each lead 11 has a taper structure increasing in width as it extends inwardly into the resin encapsulate 4 from the bottom of the resin encapsulate 4, there is no possibility for the leads 11 to be separated from the resin encapsulate 4 even when they receive cutting impact during a singulation process.

The semiconductor packages 1, which are illustrated in FIGS. 3C to 4 respectively, have a typical structure including a semiconductor chip 2 mounted on the paddle 16 of the lead frame 10 by means of an adhesive layer, leads 11 arranged adjacent to each of four sides of the paddle 16 while extending perpendicularly to the associated side of the paddle 16, each of the leads 11 having a lead lock 14, conductive wires 3 for electrically connecting an inner end of each lead 11 to the semiconductor chip 2, and a resin encapsulate 4 for encapsulating the semiconductor chip 2 and conductive wires 3. In this package structure, each lead 11 has a lower surface exposed at the bottom of the resin encapsulate 4.

FIGS. 5A to 5D are bottom plan views respectively illustrating lead frames 10 according to a fifth embodiment of the present invention. The lead frames 10 of the fifth embodiment have the same basic configuration as those of the above mentioned embodiments, except that a partially etched portion extends from the inner end of each inner lead 12 as the lead lock 14. Accordingly, no description will be made for the same basic configuration. FIG. 5E is a cross-sectional view partially illustrating a semiconductor package 1 fabricated using one of the lead frames 10 respectively shown in FIGS. 5A to 5D.

Figure 5A:
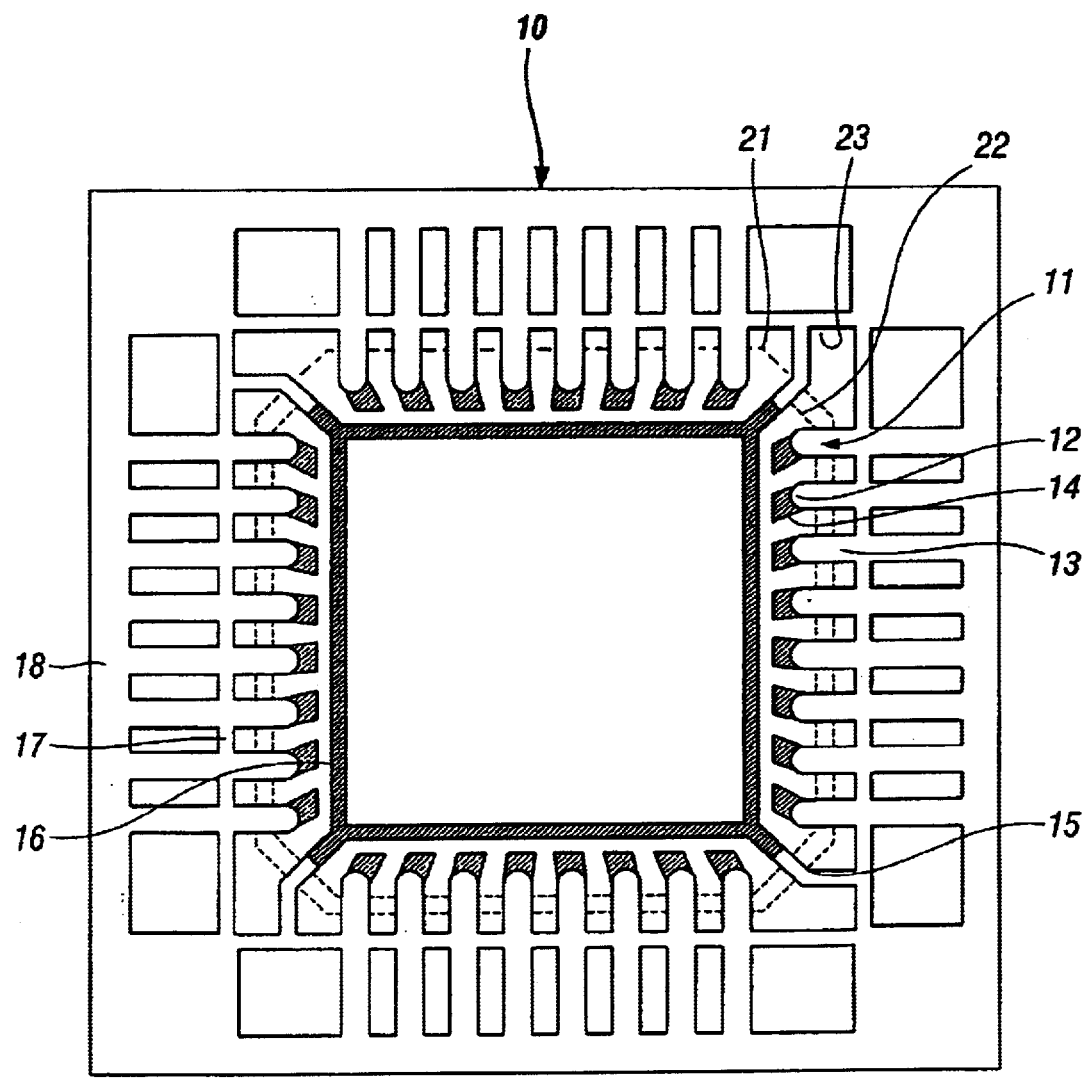
FIGS. 5A to 5D are bottom plan views respectively illustrating lead frames having an etch type lead lock according to a fifth embodiment of the present invention.

In the case of FIG. 5A, an extension extends inwardly from the inner end of each inner lead 12. The extension has a partially etched structure in such a fashion that its lower surface has a higher level than that of the lower surface of the associated inner lead 12 to provide a lead separation preventing means 14. The partially etched extensions of the inner leads 12 arranged adjacent to each side of the paddle 16 are inclined toward the center of the paddle side in such a fashion that they have an increased inclination at positions away from the center of the paddle side, that is, toward the corners of the paddle 16. That is, the partially etched extensions arranged adjacent to both ends of each side of the paddle 16 extend substantially in parallel to the tie bars 15 arranged adjacent thereto, respectively. Since the lower surface of each extension has a higher level than that of the lower surface of the associated inner lead 12, the extension is encapsulated in a resin encapsulate 4 molded in a resin encapsulating process, as shown in FIG. 5E. Accordingly, all leads 11 can be firmly locked in position (e.g., laterally and vertically) even when they receive cutting impact during a singulation process. Accordingly, it is possible to effectively prevent the leads 11 from being separated from the resin encapsulate 4 in the singulation process.

Figure 5B:
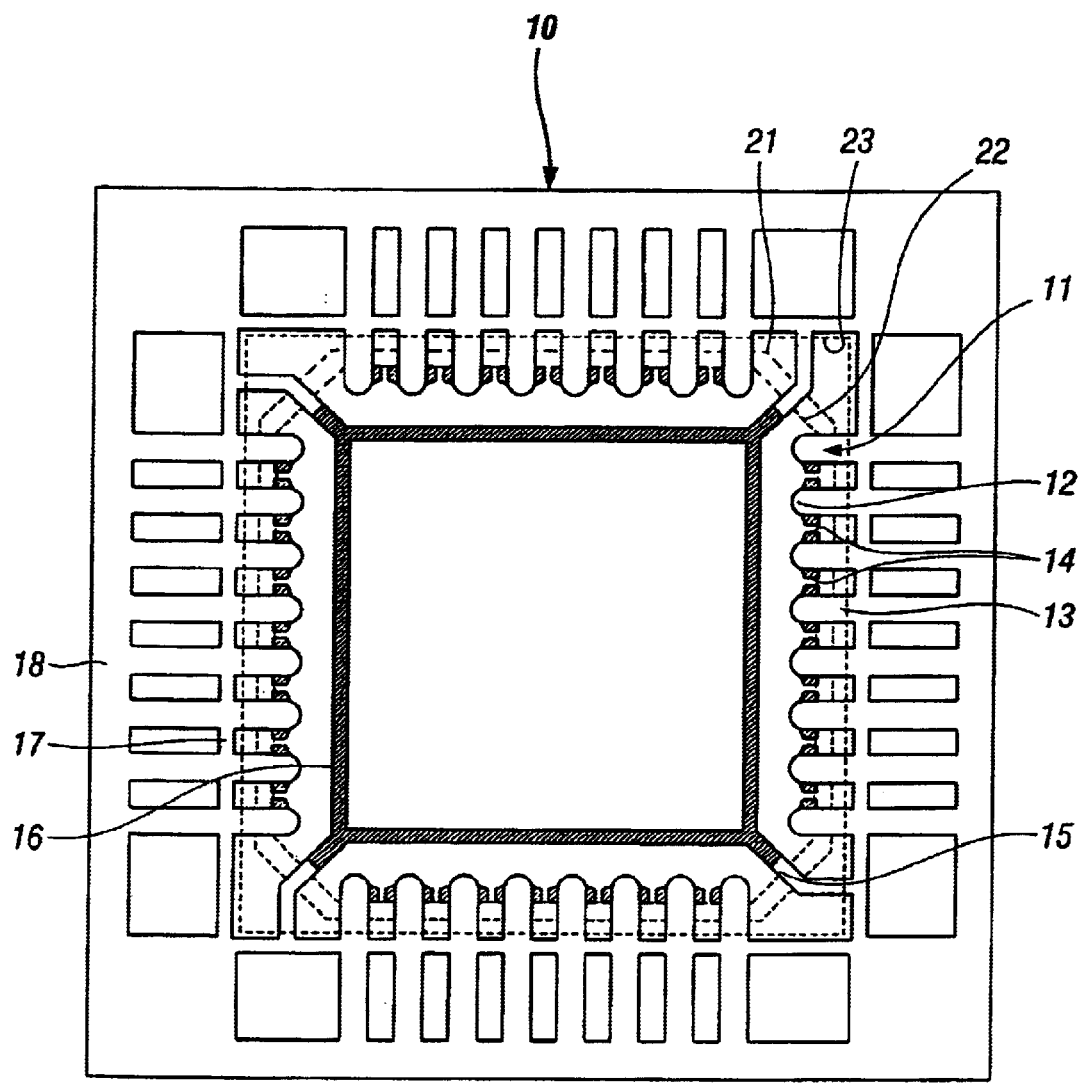

In the case of FIG. 5B, wings extend laterally from opposite side edges of each inner lead 12, respectively. Each wing has a partially etched structure in such a fashion that its lower surface has a higher level than that of the lower surface of the associated inner lead 12 to provide a lead lock 14. No wing is provided at the side edge of each inner lead 12 arranged adjacent to an associated one of the tie bars 15. However, this is not construed to limit the present invention. In accordance with the present invention, wings may be provided at both side edges of each inner lead 12 arranged adjacent to an associated one of the tie bars 15.

Figure 5C:
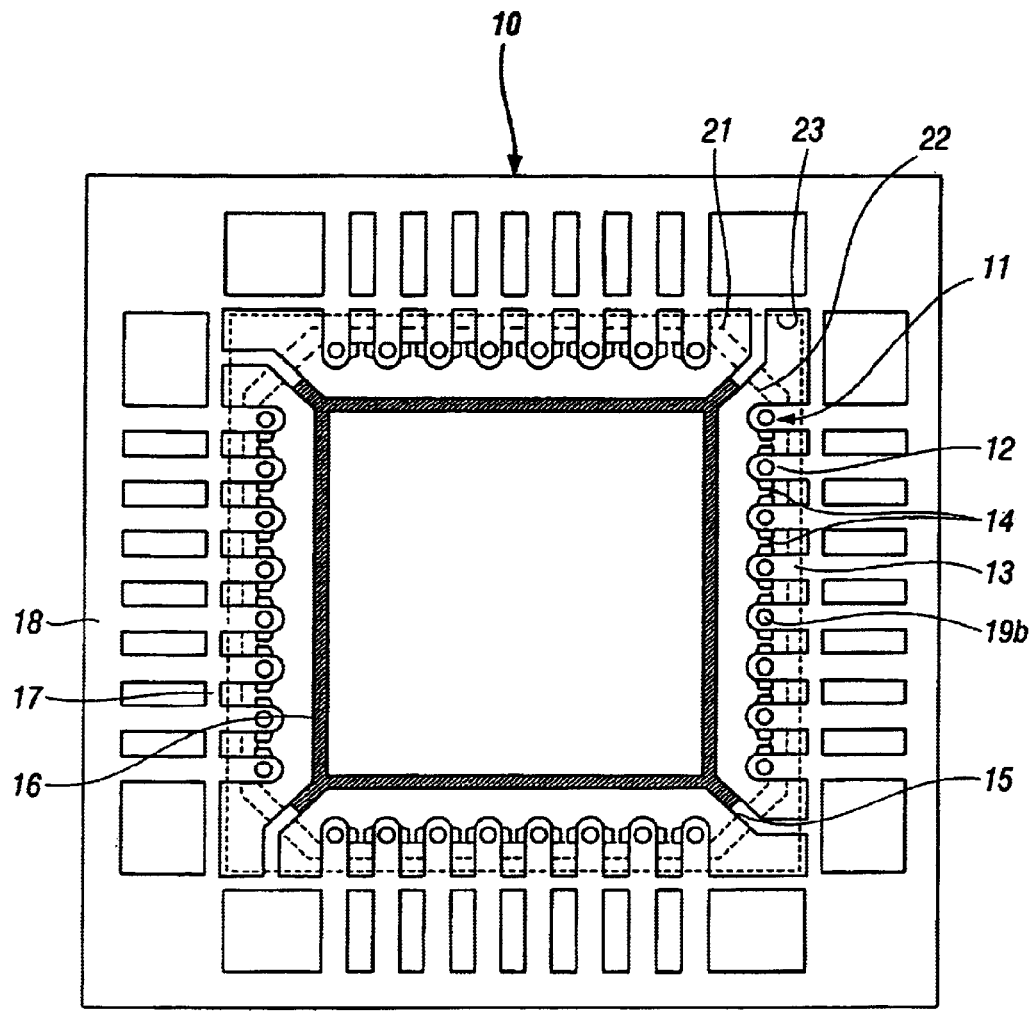

In the case of FIG. 5C, a lug 19b is protruded from the upper surface of each inner lead 12 at the inner end of the inner lead 12, in addition to the wings, to provide a lead lock 14. The lug 19b can be electrically connected directly to an associated one of pads on a semiconductor chip. Such a lug may be applied to any one of the above mentioned embodiments of the present invention or embodiments to be described hereinafter.

Figure 5D:
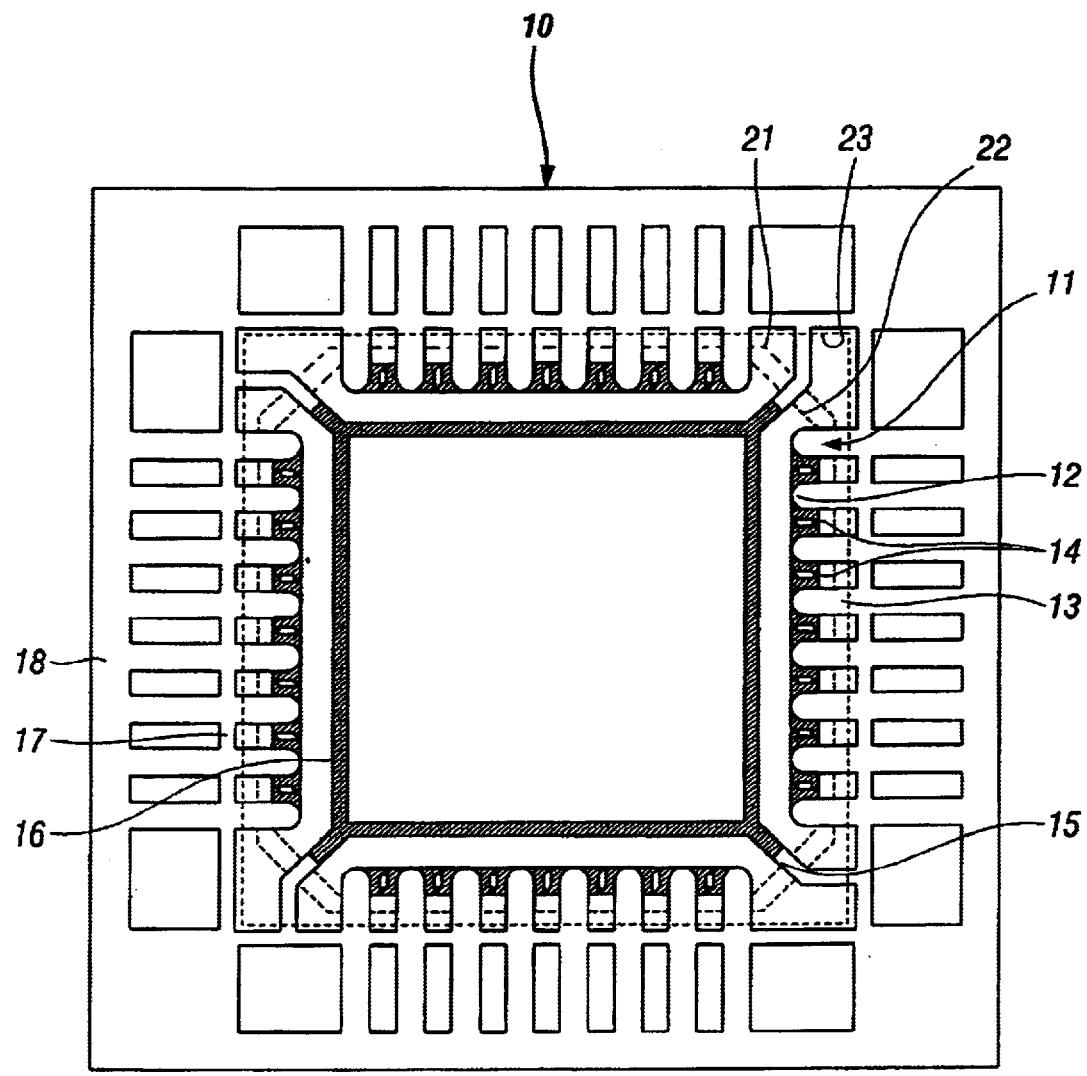
Figure 5E:
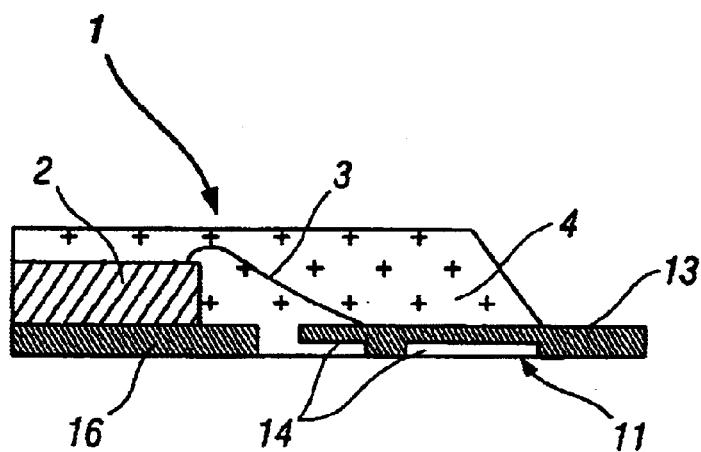
FIG. 5E is a cross-sectional view partially illustrating a semiconductor package fabricated using the lead frame shown in FIG. 5A.

In the case of FIG. 5D, L-shaped wings extend from opposite side edges of each inner lead 12 at the inner end of the inner lead 12, respectively. Each wing has a partially etched structure in such a fashion that its lower surface has a higher level than that of the lower surface of the associated inner lead 12 to provide a lead lock 14. No wing is provided at the side edge of each inner lead 12 arranged adjacent to an associated one of the tie bars 15. However, this is not construed to limit the present invention. Also, although the wings have a L shape, they may have other shapes.

Referring to FIG. 5E, it can be found that the lead lock 14 comprises a partially etched portion extending inwardly from the inner end of each lead 12 while being buried in a resin encapsulate 4. Such a partially etched portion may also be provided at the intermediate portion of each lead 12, as shown in FIG. 5E. Although the partially etched portions are shown as being formed by partially etching the low surface of each lead 12, they may be formed at the upper surface of each lead 12. The formation of the partially etched portion at the intermediate portion of each lead 12 is optional in accordance with the present invention.

Figure 6A:
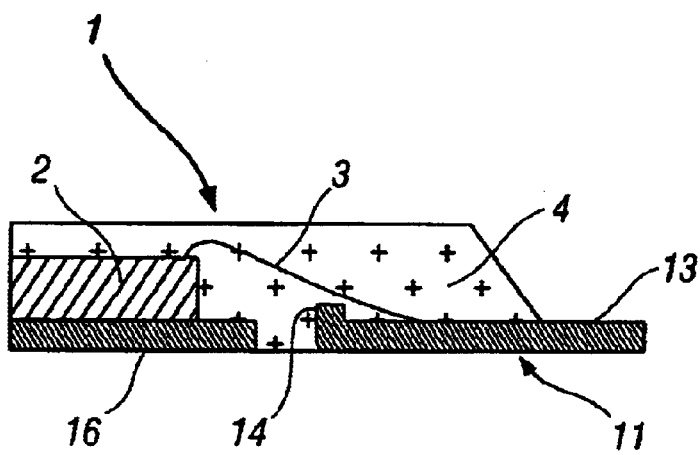
FIGS. 6A and 6B are cross-sectional views partially illustrating lead frames configured to have a bent-lead lead lock in accordance with a sixth embodiment of the present invention, respectively.
Figure 6B:
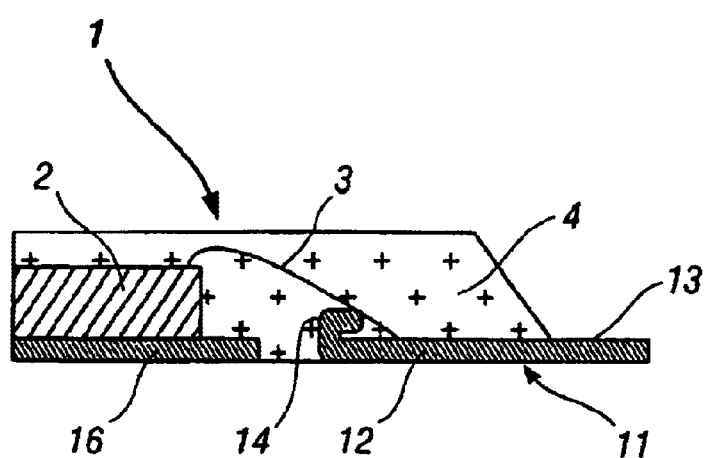

FIGS. 6A and 6B are cross-sectional views partially illustrating lead frames 10 configured to have a bent lead lock 14 in accordance with a sixth embodiment of the present invention, respectively. The lead frames of the sixth embodiment have the same basic configuration as those of the above mentioned embodiments, except that the inner end of each inner lead 12 has a bent structure to provide the lead lock 14. Accordingly, no description will be made for the same basic configuration.

In accordance with the sixth embodiment of the present invention, the lead lock 14 is provided by simply bending the inner end of each inner lead 12. Accordingly, this embodiment is more effective to prevent the leads 11 from being separated from a resin encapsulate in a singulation process, as compared to the embodiments involving formation of locking lugs, wings, or dimples. In the case of FIG. 6A, the lead lock 14 comprises the inner end of each inner lead 12 upwardly bent in perpendicular to the plane of the inner lead 12. In the case of FIG. 6B, the lead lock 14 comprises the inner end of each inner lead 12 bent by an angle of about 180 degrees in such a fashion that it extends in parallel to the plane of the inner lead 12. The bending direction of the inner end of each inner lead 12 is optional in accordance with the present invention.

Although a variety of lead frames 10 and a variety of semiconductor packages 1 using those lead frames 10 in accordance with the above mentioned first through six embodiments of the present invention have been described, it will be appreciated that a lead frame configured in accordance with an optional combination of the above mentioned embodiments and a semiconductor package fabricated using this lead frame may also be included in the scope of the present invention.

FIGS. 7A to 7D are cross-sectional views respectively illustrating lead end grid array type semiconductor packages 1 according to other embodiments of the present invention adapted to accomplish the third and fourth objects of the present invention.

The semiconductor packages 1, which are illustrated in FIGS. 7A to 7D respectively, have a typical structure including a paddle 16, and leads 11 arranged adjacent to each of four sides or two facing sides of the paddle 16 while extending perpendicularly to the associated side of the paddle 16. Each lead 11 has an inward protrusion 19 at the inner end thereof. The package structure also includes a semiconductor chip 2 mounted on the paddle 16 in such a fashion that its peripheral portion is arranged on or above the inner ends of the leads 11, an electrical insulating means 32 for preventing an electrical contact between the upper surface of each lead 11 at the inner end of the lead 11 and the lower surface of the semiconductor chip 2 at the peripheral portion of the semiconductor chip 2, conductive wires 3 for electrically connecting the leads 11 to the semiconductor chip, respectively, a resin encapsulate 4 for encapsulating the semiconductor chip 2 and conductive wires 3, and solder balls 5 attached to the lower surfaces of the protrusions 19 of the leads 11 arranged within a region where the resin encapsulate 4 is formed, respectively. The solder balls 5 serve to external input/output terminals.

Figure 7A:
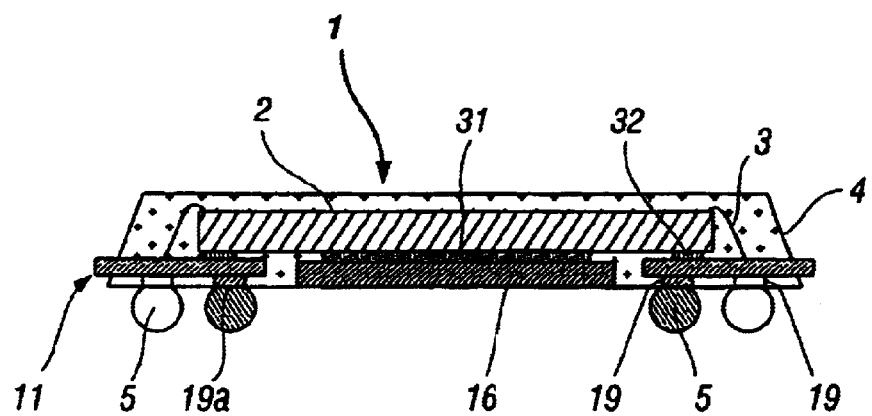
FIGS. 7A to 7D are cross-sectional views respectively illustrating lead end grid array type semiconductor packages according to other preferred embodiments of the present invention.

In the case of FIG. 7A, the leads 11 may selectively have a lead separation preventing means (not shown). In accordance with the embodiment illustrated in FIG. 7A, the electrical insulating means 32 comprises a double-sided adhesive polyimide tape or a typical adhesive polymer resin layer. The polymer resin may be, for example, epoxy resin. The protrusion 19 of each lead 11 is formed by partially etching the lower surface of the lead 11 at the inner end of the lead 11 and locks the lead to encapsulant 4. Each protrusion 19 has a lower surface serving as a solder ball land 19a, This solder ball land 19a is exposed at the bottom of the resin encapsulate 4. The solder ball lands 19a of the leads 11 are selectively attached with solder balls 5 serving as external input/output terminals.

In the semiconductor package 1 illustrated in FIG. 7A, a thermally-conductive adhesive layer 31 is interposed between the lower surface of the semiconductor chip 2 and the upper surface of the paddle 16. Also, an insulating adhesive layer, which serves as the electrical insulator layer 32, is interposed between the upper surface of each lead 11 at the inner end of the lead 11 and the lower surface of the semiconductor chip 2 at the peripheral portion of the semiconductor chip 2.

Accordingly, it is possible to effectively eliminate a short circuit occurring when the leads come into contact with the lower surface of the semiconductor chip 2 at its upper surface. Also, all leads 11 can be firmly locked in position even when they receive cutting impact during a singulation process carried out after the formation of the resin encapsulate 4. Accordingly, there is no possibility for the leads 11 to be separated from the resin encapsulate 4 or for the conductive wires 3 bonded to the leads 11 to be short-circuited due to heat or vibrations.

Figure 11:
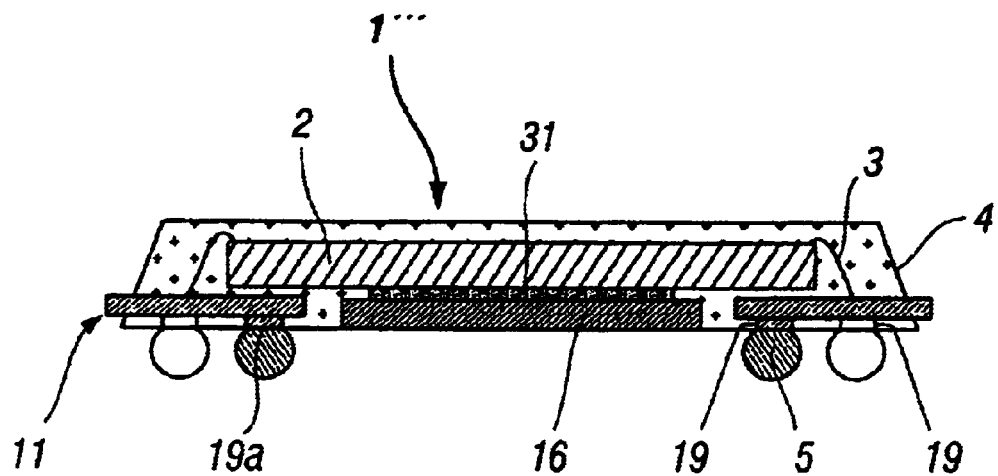
FIG. 11 is a cross-sectional view illustrating a conventional lead end grid array type semiconductor package.

The phenomenon wherein the leads 11 come into contact with the lower surface of the semiconductor chip 2 may occur in the case wherein the semiconductor chip 2 is bonded to the paddle 16 without keeping its accurate horizontal position, wherein a lead sweeping phenomenon causing the inner ends of the leads 11 to be raised or laterally leaned occurs during the process for injecting melted resin of high temperature and pressure to mold the resin encapsulate 4, or wherein the inner ends of the leads 11 are deformed, due to a careless operator, in such a fashion that they are raised. When the leads 11 come into contact with the lower surface of the semiconductor chip 2, as mentioned above, a short circuit or electric leakage may occur. As a result, the semiconductor package 1'" of FIG. 11 may operate abnormally or break down.

For the thermally-conductive adhesive layer 31 for bonding the semiconductor chip 2 to the paddle 16, a silver-filled epoxy resin adhesive is typically used, even though the present invention is not limited thereto. The thermally-conductive adhesive layer 31 and/or the insulating adhesive layer 32 as the electrical insulating means is coated in accordance with a printing or dispensing process. The coated layer is set at a high temperature after the mounting of the semiconductor chip 2, so as to firmly bond the semiconductor chip 2. Where a double-sided adhesive polyimide tape is used as mentioned above, it may be attached to the inner end of each inner lead 12. Alternatively, double-sided adhesive polyimide tapes each having a strip shape may be used. In this case, each double-sided adhesive polyimide tape is attached to the inner ends of the inner leads 12 arranged adjacent to an associated side of the paddle 16. Alternatively, a double-sided adhesive polyimide tape is attached to the inner ends of the inner leads 12 arranged adjacent to an associated side of the paddle 16. Alternatively, a double-sided adhesive polyimide tape having a rectangular or square loop shape may also be used. In this case, the tape is attached to the inner ends of all inner leads 12 arranged around the paddle 16 (FIG. 1).

Figure 7B:
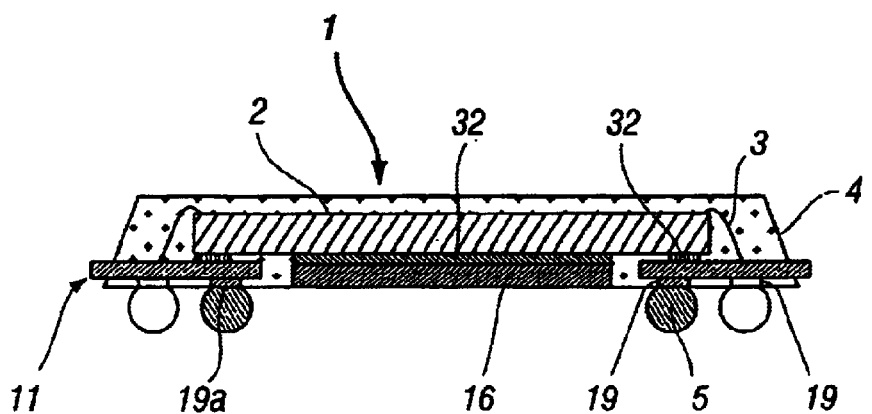

The semiconductor package 1 of FIG. 7B has the same basic configuration as that of FIG. 7A, except that only the insulating adhesive layer 32 made of an insulating adhesive resin such as an epoxy adhesive resin is formed on the paddle 16 without formation of the thermally-conductive adhesive layer 31 made of, for example, a silver-filled epoxy resin. Accordingly, no further description will be made.

Figure 7C:
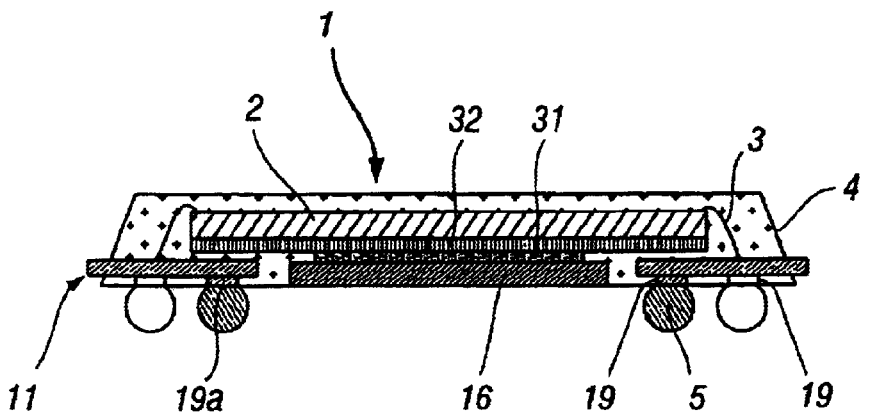

The semiconductor package 1 of FIG. 7C has the same basic configuration as that of FIG. 7A. Accordingly, no description will be made for the same basic configuration. In the case of FIG. 7C, an insulating material such as polyimide is uniformly coated over the entire lower surface of the semiconductor chip 2 using a well-known process such as a spin coating process, a duct blade process, a spraying process, a dispensing process or a printing process. The coated layer is then set at a high temperature. Practically, the insulating material is coated over a wafer (not shown) including a plurality of semiconductor chips 2. Accordingly, a sawing process is carried out to separate the wafer into package units respectively including individual semiconductor chips 2 each coated with the insulating layer 32 over the entire lower surface thereof. Each semiconductor chip 2 is then mounted on the paddle 16 of a lead frame having a configuration according to the present invention by means of a well-known thermally-conductive adhesive layer. In the case of FIG. 7C, accordingly, the inner end of each lead 11 is maintained not to come into direct contact with the lower surface of the semiconductor chip 2. As a result, there is no problem such as a short circuit or electric leakage even when the semiconductor chip 2 is bonded to the paddle 16 without keeping its accurate horizontal position or when a lead sweeping phenomenon occurs during a molding process.

Figure 7D:
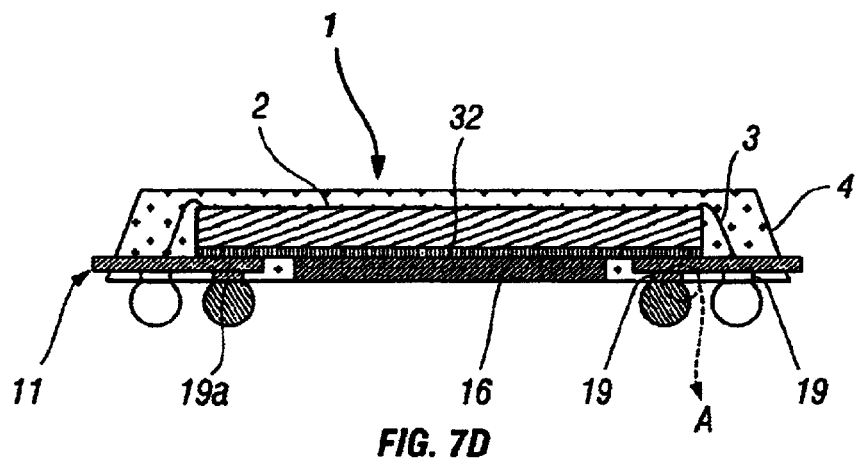

The semiconductor package 1 of FIG. 7D has the same basic configuration as that of FIG. 7A, except that only the insulating adhesive layer 32 made of an insulating adhesive resin such as an epoxy adhesive resin is formed on the paddle 16. Accordingly, no further description will be made.

The semiconductor package 1, which has a configuration shown in one of FIGS. 7A to 7D, can be fabricated by mounting a semiconductor chip 2 having input/output pads (not shown) on the paddle 16 of a lead frame 10 having a plurality of leads 11, each having an inner lead and an outer lead integral with each other, in such a fashion that the peripheral portion of the semiconductor chip 2 is arranged on or above the inner leads of the leads 11 in accordance with a fabrication method of the present invention. This method includes a semiconductor chip mounting step for mounting a semiconductor chip on the upper surface of inner leads, included in each of lead frame units of a lead frame strip, at the inner ends of the inner leads by means of a thermally-conductive insulating means 32, a wire bonding step for electrically connecting the inner end of each inner lead to an associated one of input/output pads of the semiconductor chip via a conductive wire 3, a resin encapsulate molding step for molding a resin encapsulate 4 adapted to encapsulate the semiconductor chip along with the conductive wires 3 and inner leads associated with the semiconductor chip while allowing each of the associated inner leads to have a portion exposed at the bottom of the resin encapsulate 4, an optional solder ball attaching step for attaching solder balls 5, as external input/output terminals, to the exposed portions of the inner leads, and a singulation step for cutting the outer leads of the lead frame strip around the resin encapsulates 4 at regions where the outer ends of the outer leads respectively included in adjacent ones of the lead frame units are connected to each other.

Since the formation of the electrical insulating means 32 has been described in detail, no description thereof will be made.

Figure 8:
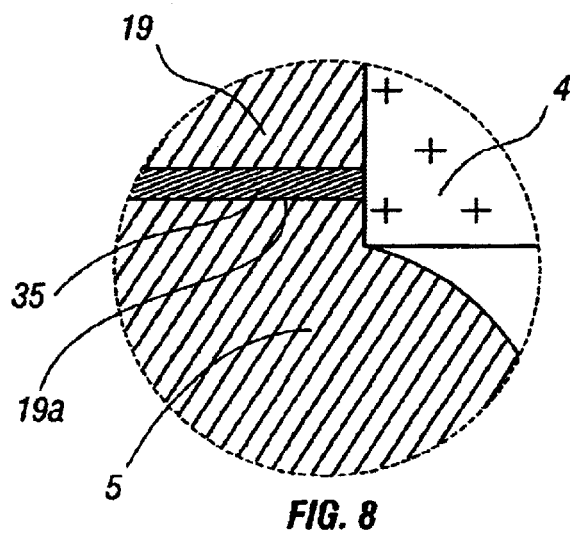
FIG. 8 is an enlarged view corresponding to a portion A of FIG. 7D.

FIG. 8 is an enlarged view corresponding to a portion A of FIG. 7D. Referring to FIG. 8, a configuration capable of accomplishing the fifth object of the present invention will be described. FIG. 8 illustrates a cross section of a structure obtained after cleaning the solder ball lands 19a by removing the lower portion of each protrusion 19, exposed at the bottom of the resin encapsulate 4 in the semiconductor package 1, to a desired depth and over a desired area, selectively plating a metal 35 such as gold and/or nickel, and/or aluminum, or an alloy thereof on the cleaned solder ball lands 19a, and then fusing solder balls 5, as external input/output terminals, on the plated solder ball lands 19a.

The semiconductor package fabrication method capable of accomplishing the fifth object of the present invention will now be described in conjunction with FIG. 7D and FIG. 1. In this method, a lead frame is used which includes a plurality of lead frame units 10 each having a paddle 16, and a plurality of leads 11 arranged adjacent to each of four sides or two facing sides of the paddle. Each lead 11 has an inner lead and an outer lead integral with each other. The inner lead of each lead 11 has a protrusion 19 protruded from the lower surface of the inner lead at the inner end of the inner lead 11. This method includes a semiconductor chip mounting step for mounting a semiconductor chip on the paddle 16 of each lead frame unit 10, a wire bonding step for electrically connecting the mounted semiconductor chip 2 to the inner end of each inner lead 11 at the upper surface of the inner lead 11 via a conductive wire 3, a resin encapsulate molding step for molding a resin encapsulate 4 adapted to encapsulate the semiconductor chip along with the conductive wires 3 and the inner ends of the inner leads associated with the semiconductor chip while allowing each of the protrusions 19 to have a lower surface exposed at the bottom of the resin encapsulate 4, a marking and cleaning step for radiating a laser beam onto a surface of the resin encapsulate 4, a marking and cleaning step for radiating a laser beam onto a surface of the resin encapsulate 4 to mark characters or signs of the surface of the resin encapsulate 4 while radiating a laser beam onto the lower surface of each protrusion 19 to remove set resin coated on the lower surface of the protrusion 19 after being flashed during the resin encapsulate molding step, thereby cleaning the lower surface of the protrusion, an optional solder ball attaching step for attaching solder balls 5, as external input/output terminals, to the cleaned lower surfaces of the protrusions 19, and a singulation step for cutting the outer leads of the lead frame strip around the resin encapsulates 4 at regions where the outer ends of the outer leads respectively included in adjacent ones of the lead frame units 10 are connected to each other.

The semiconductor chip mounting step is carried out using an adhesive layer 31 and/or an adhesive layer 32 interposed between the semiconductor chip 2 and the paddle 16 of the lead frame 10. This can be appreciated by referring to the aforementioned description. At the marking and cleaning step, a laser beam is radiated onto a selected surface portion of the resin encapsulate 4 to indicate characters or signs representing the manufacturer or model name. Also, a laser beam is radiated onto the lower surface of each protrusion 19, thereby removing set resin coated on the lower surface of the protrusion 19 after being flashed during the resin encapsulate molding step. Each of the protrusions 19 may have a desired irregularity shape having a desired area and a desired depth so that the protrusions 19 provide a desired pattern, such as a matrix pattern, a line patter, a dot pattern, or a line/dot pattern, having an increased surface area, thereby being capable of providing an increased fusing force of solder balls to be formed at the subsequent solder ball attaching step which may be optionally carried out.

Optionally, a plating step may also be conducted to plate gold and/or nickel, and/or aluminum, or an alloy thereof on the cleaned solder ball lands 19a. In this case, solder balls 5 serving as external input/output terminals can be easily and securely attached to the solder ball lands 19a at the solder ball attaching step, respectively.

The marking and cleaning step is conducted using a laser beam emitted from a $CO_2$ laser, an Nd laser, a diode laser, or an excimer laser. The marking step and the cleaning step can be performed in a simultaneous or sequential fashion using one or more laser.

In accordance with the semiconductor package fabrication method for accomplishing the fifth object of the present invention, it is possible to safely and surely remove, using the existing marking machine, set resin coated on solder ball lands after being flashed during a resin encapsulate molding process, without causing generation of static electricity, formation of cracks, environmental pollution, and requirement of any separate machine. Accordingly, there is no problem such as a degradation in the fusion quality of solder balls 5 resulting in a break-down of the final product. Thus, this method is an economical and efficient semiconductor package fabrication method.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

We claim:

1. A method of fabricating a semiconductor package, comprising steps of:
    providing a leadframe having a paddle and a plurality of leads which each define upper and lower surfaces and inner and outer ends;
    mounting an electrical insulating means to at least a peripheral portion of a semiconductor chip having a plurality of input/output pads;
    mounting the semiconductor chip to the paddle such that the peripheral portion of the semiconductor chip extends over at least a portion of the upper surface of each of the leads and is separated therefrom by the electrical insulating means;
    wire bonding at least one of the input/output pads of the semiconductor chip to at least one of the leads via a conductive wire; and
    encapsulating the semiconductor chip, the paddle, the leads, the electrical insulating means, and the conductive wire with a resin encapsulant such that at least a portion of each of the leads is exposed within the resin encapsulant.

2. The method of claim 1 further comprising the step of:
    attaching a solder ball to the exposed portion of each of the leads.

3. The method of claim 1 wherein the step of mounting the semiconductor chip to the paddle comprises mounting the semiconductor chip to the paddle via a thermally conductive adhesive layer.

4. The method of claim 1 wherein the semiconductor chip has an upper surface including the input/output pads disposed thereon and a lower surface, the step of mounting the electrical insulating means to the semiconductor chip comprises mounting the electrical insulating means to the lower surface of the semiconductor chip, and the step of mounting the semiconductor chip to the paddle comprises mounting the semiconductor chip to the paddle and to portions of the upper surfaces of the leads via the electrical insulating means.

5. The method of claim 1 further comprising the step of:
    radiating a laser beam onto the portion of each of the leads exposed within the resin encapsulant.

6. A method of fabricating a semiconductor package, comprising the steps of:
    providing a leadframe having a paddle and a plurality of leads which each define upper and lower surfaces and at least one protrusion disposed on the lower surface;
    mounting a semiconductor chip to the paddle of the leadframe;
    electrically connecting the semiconductor chip to the upper surface of at least one of the leads via a conductive wire;
    encapsulating the semiconductor chip, the paddle, the leads and the conductive wire with a resin encapsulant such that a portion of the protrusion of each of the leads is exposed within the resin encapsulant; and
    radiating a laser beam onto the exposed portion of each of the protrusions and onto the resin encapsulant.

7. The method of claim 6 further comprising the step of:
    attaching a solder ball to the irradiated portion of each of the protrusions.

8. The method of claim 6 wherein the step of radiating the laser beam comprises using the laser beam to form a surface pattern on the exposed portion of each of the protrusions which is selected from the group consisting of:
    a matrix pattern;
    a line pattern;
    a dot pattern; and
    a line/dot pattern.

9. The method of claim 6 further comprising the step of:
    plating the irradiated portion of each of the protrusions with at least one metal selected from the group consisting of:
    gold;
    nickel; and
    aluminum.

10. A method of fabricating a semiconductor package, comprising the steps of:

providing a lead frame including:
- a paddle;
- a plurality of leads arranged adjacent the paddle, each of the leads having an inner end, a lower surface and a lead lock comprising at least one element selected from the group consisting of at least one locking lug, at least one disk-shaped protrusion, at least one dimple, inclined side walls having an increased width defined therebetween in an upward direction, a bent, partially etched inner end portion, at least one protrusion at the lower surface, and at least one partially etched portion at the lower surface;

mounting a semiconductor chip having a plurality of input/output pads to the paddle such that a peripheral portion of the semiconductor chip is positioned over the inner end of each of the leads;

mounting the semiconductor chip to portions of the upper surfaces of the leads via an insulating adhesive layer;

wire bonding at least one of the input-output pads of the semiconductor chip to at least one of the leads via a conductive wire; and encapsulating the semiconductor chip, the paddle, the lead lock of each of the leads, the insulating adhesive layer, and the conductive wire with a resin encapsulant such that a portion of the lower surface of each of the leads is exposed within the resin encapsulant.

11. The method of claim 10 further comprising the step of:
attaching a solder ball to the exposed portion of the lower surface of each of the leads.

12. The method of claim 10 wherein the step of mounting the semiconductor chip to the paddle comprises mounting the semiconductor chip to the paddle via a thermally conductive adhesive layer.

13. The method of claim 10 wherein the semiconductor chip has an upper surface including the input/output pads disposed thereon and a lower surface, and the steps of mounting the semiconductor chip to the paddle and to the leads comprise mounting the semiconductor chip to the paddle and to portions of the upper surfaces of the leads via an insulating adhesive layer which is applied to the lower surface of the semiconductor chip.

14. The method of claim 10 further comprising the step of:
radiating a laser beam onto the portion of the lower surface of each of the leads exposed within the resin encapsulant.

15. The method of claim 14 wherein the step of radiating the laser beam comprises using the laser beam to form a surface pattern on the exposed portion of the lower surface of each of the leads which is selected from the group consisting of:
- a matrix pattern;
- a line pattern;
- a dot pattern; and
- a line/dot pattern.

16. The method of claim 14 further comprising the step of:
plating the irradiated portion of the lower surface of each of the leads with at least one metal selected from the group consisting of:
- gold;
- nickel; and
- aluminum.

* * * * *